(12) United States Patent
Hinkle

(10) Patent No.: US 8,000,105 B2
(45) Date of Patent: Aug. 16, 2011

(54) TUBULAR MEMORY MODULE

(75) Inventor: Jonathan Randall Hinkle, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 320 days.

(21) Appl. No.: 12/172,580

(22) Filed: Jul. 14, 2008

(65) Prior Publication Data

US 2010/0008034 A1    Jan. 14, 2010

(51) Int. Cl.
 *H05K 1/00* (2006.01)
(52) U.S. Cl. ........................................ 361/749; 361/697
(58) Field of Classification Search .................. 361/697, 361/702, 749, 777, 804; 174/15.1, 16.3, 174/250, 252
See application file for complete search history.

(56) References Cited

U.S. PATENT DOCUMENTS

| | | |
|---|---|---|
| 4,510,551 A | 4/1985 | Brainard, II |
| 4,697,205 A | 9/1987 | Eastman |
| 4,727,410 A | 2/1988 | Higgins, III |
| 4,747,450 A | 5/1988 | Ikegame et al. |
| 4,860,164 A | 8/1989 | Kaufman |
| 4,928,206 A | 5/1990 | Porter et al. |
| 5,448,511 A | 9/1995 | Paurus et al. |
| 5,767,824 A | 6/1998 | Jacobsen |
| 6,256,203 B1 | 7/2001 | Ingraham et al. |
| 6,665,182 B2 | 12/2003 | Hogerl |
| 7,221,868 B2 | 5/2007 | Terada et al. |
| 7,324,352 B2 | 1/2008 | Goodwin |
| 2004/0118690 A1 | 6/2004 | Yoshitani |
| 2005/0082663 A1* | 4/2005 | Wakiyama et al. ........... 257/717 |
| 2007/0211426 A1* | 9/2007 | Clayton et al. ................ 361/689 |

* cited by examiner

*Primary Examiner* — Yuriy Semenenko
(74) *Attorney, Agent, or Firm* — Cynthia G. Seal; Jeffrey L. Streets

(57) ABSTRACT

Memory systems and methods of forming memory modules. In one embodiment, a computer memory system includes a substantially tubular frame with an elongate card edge extending along the frame. A flexible circuit comprising a flexible substrate, a plurality of memory chips affixed to the flexible substrate, and a plurality of electrical terminals interconnected with the memory chips, is secured along a perimeter of the tubular frame with the electrical terminals arranged along the card edge.

9 Claims, 10 Drawing Sheets

TUBULAR MEMORY MODULE

BACKGROUND OF THE INVENTION

1. Field of the Invention

The present invention relates to computer system memory, and more specifically to memory modules.

2. Background of the Related Art

In space-constrained computer systems, there are significant design challenges in fitting all of the desired features and functions for a product within a given form factor. These challenges are present in the design of most computer systems, and particularly in compact systems such as blade servers. Blade servers provide a robust set of features and performance capabilities within the space constraints of industry-standard module dimensions. Blade servers and subsystems must also address thermal and power demands so that the subsystems may operate at increasing performance levels. For example, increasing the capacity and performance of memory of a blade server is accompanied by the associated challenges of fitting the memory within a compact blade server housing and sufficiently cooling the memory.

BRIEF SUMMARY OF THE INVENTION

One embodiment of the present invention provides a computer memory system having a substantially tubular frame. An elongate card edge extends along the frame. A flexible circuit includes a flexible substrate, a plurality of memory chips secured to the flexible substrate, and a plurality of electrical terminals interconnected with the memory chips. The flexible circuit is secured along a perimeter of the tubular frame with the electrical terminals arranged along the card edge.

Another embodiment of the invention provides a method of forming a memory module. A flexible circuit is formed, including securing a plurality of memory chips to a flexible substrate and forming a plurality of electrical terminals on the flexible substrate. Electrical pathways are formed along the flexible substrate connecting the memory chips with the electrical terminals. The flexible circuit is secured along a perimeter of the substantially tubular frame with the electrical terminals arranged along a card edge of the substantially tubular frame.

DETAILED DESCRIPTION OF THE INVENTION

Embodiments of the invention presented below include various configurations of a tubular memory module and methods of forming a tubular memory module. For example, in at least one embodiment, a memory module has a tubular frame with nine panels coupled at the edges to form a square tubular cross-section. A card edge extends along the tubular frame. A flexible circuit having a plurality of "DRAM" memory chips is secured to the tubular frame, with a plurality of electrical terminals positioned along the card edge. Each panel of the tubular frame supports at least one row of memory packages, with each memory package having one or more "DRAM" memory chips. The memory module may be connected to a memory module connector on a circuit board, such that the electrical terminals positioned along the card edge electrically contact corresponding electrical terminals in the memory module connector. A memory controller on the circuit board may then read and write to the memory module.

Several alternative embodiments are presented in the accompanying figures. These embodiments include a variety of alternative memory module configurations, including memory modules with different cross-sectional shapes, with different quantities of memory chips, and with different configurations and routings for the flexible circuit. At least one configuration has the flexible circuit secured to an interior surface of the tubular frame, and optionally routes the flexible circuit through a slot in the tubular frame. In another configuration, the flexible circuit is secured to an exterior surface of the tubular frame, without the need for slots. Different methods of forming a tubular memory module are also presented. For example, the memory module may be formed by first securing the flexible circuit to the coupled panels, and then manipulating the panels to form the frame with the flexible circuit already attached. Alternatively, the memory module may be formed by securing the flexible circuit to a pre-fabricated tubular frame, such as by securing the flexible circuit to an exterior surface of the pre-fabricated frame or by rolling up the flexible circuit, inserting it into the pre-fabricated frame, and pulling the ends through slots in the tubular frame.

The embodiments discussed below provide memory capacity and performance, with favorable airflow, a low pressure drop, a large thermal transfer surface area, and a high-capacity DRAM chip arrangement. Airflow can flow through the memory module and thermally-conductive panels may conduct heat away from the DRAM chips at a high heat-transfer rate, for efficient heat removal. The tubular frame provides good separation between DRAM chips, for low power density. The DRAM chips are also protected from mechanical damage when positioned inside the tubular frame.

Figure 1:
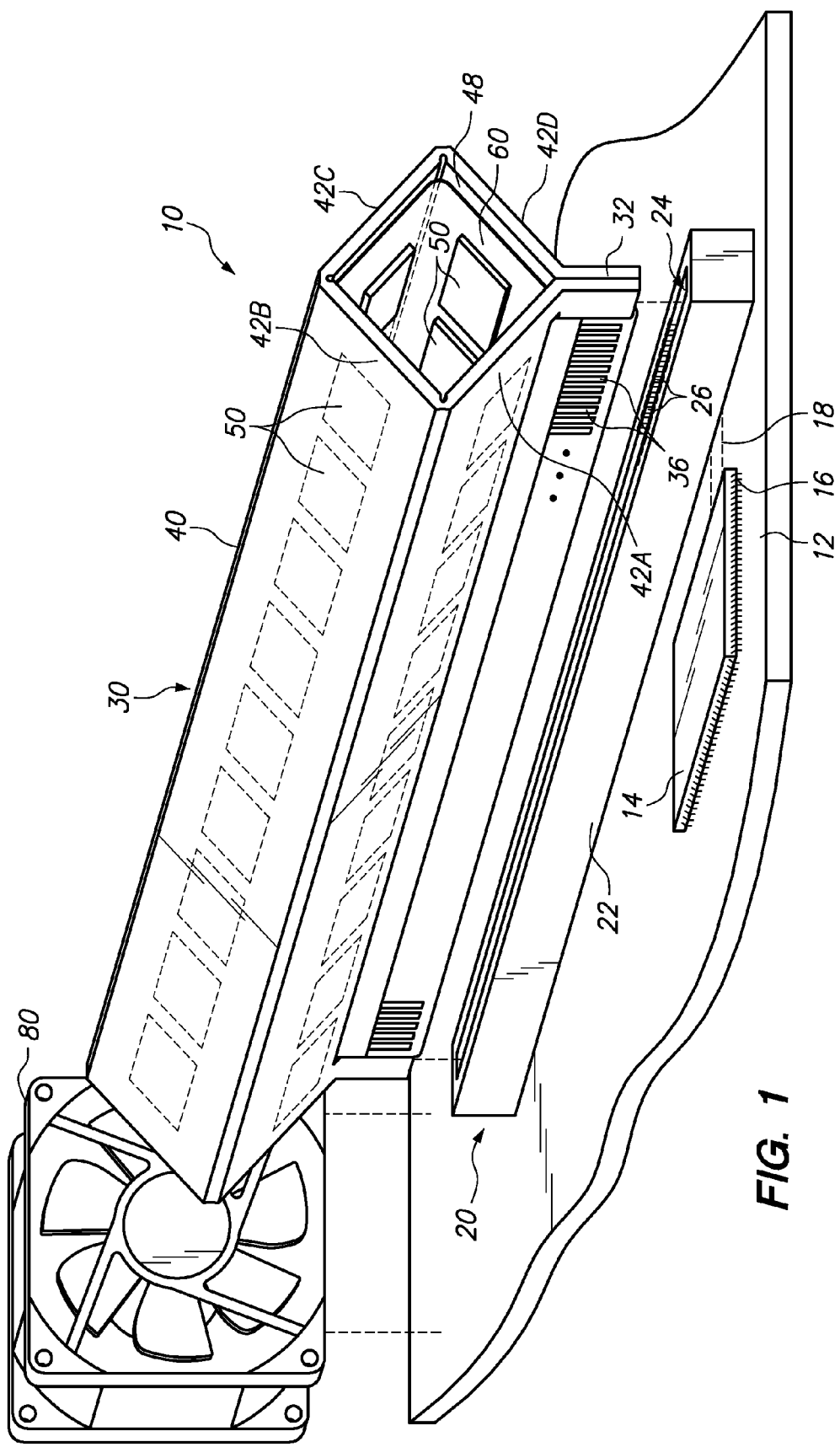
FIG. 1 is a perspective, partial-assembly view of a computer memory system including an exemplary memory module according to one embodiment of the invention.

FIG. 1 is a perspective, partial-assembly view of an exemplary computer memory system 10 according to one embodiment of the invention. The memory system 10 includes a substantially tubular memory module 30 for removably connecting to a memory module connector 20 provided on a circuit board, which may be a motherboard 12. The memory module 30 includes a substantially tubular frame 40 having a non-circular tubular cross-section, and with four elongate panels 42A, 42B, 42C, 42D coupled at adjacent edges. A flexible circuit 60 having a plurality of rectangular "memory packages" 50 is disposed along an interior surface 48 of the tubular frame 40. Each memory package 50 may be a single memory chip, such as a dynamic random access memory (DRAM) chip. Each memory package 50 may alternatively include multiple stacked chips or the equivalent. For example, each memory package 50 may be formed of stacked DRAM die, such as a dual-die package (DDP) or quad-die package (QDP), having a footprint similar to that of a single-die package, but having a greater memory capacity than a single chip.

The memory packages 50 are arranged in rows on the flexible circuit 60. Each panel 42A-D of the frame 40 mechanically supports a row of the memory packages 50. By way of example, nine memory packages 50 per row are shown per row. With four panels 42A-D on the frame 40, and with nine memory packages 50 per row/panel, this embodiment of the memory module 30 provides a total of thirty-six memory packages 50. Other quantities of memory packages 50 may also be chosen, For example, as many as eighteen memory packages per panel may be provided, with each group of eighteen memory packages including a row of nine memory packages on each side of the flexible circuit, for a total of seventy-two memory packages.

Figure 1A:
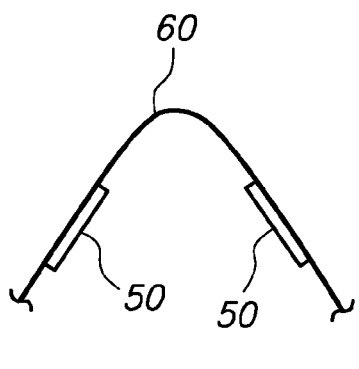
FIG. 1A is a schematic side view of the flexible circuit wherein the memory packages are secured directly to the flexible circuit.
Figure 1B:
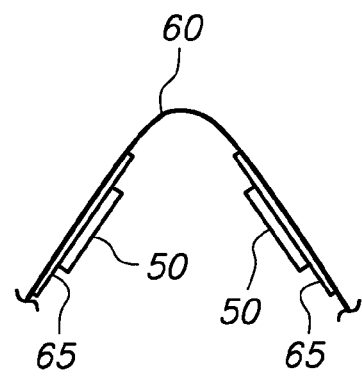
FIG. 1B is a schematic side view of the flexible circuit wherein the memory packages are alternatively secured to rigid PCB sections, with each PCB section being secured to a portion of the flexible circuit.

The memory packages 50 may be secured directly or indirectly to the flexible circuit 60. For example, FIG. 1A is a schematic side view of the flexible circuit 60 wherein the memory packages 50 are secured directly to the flexible circuit 60. FIG. 1B is a schematic side view of the flexible circuit 60, wherein the memory packages 50 are alternatively secured to rigid sections of printed circuit board ("PCB") 65, with each PCB section 65 being secured to a portion of the flexible circuit 60. Thus, each panel 42A-D could have a rigid PCB 65 mounted to it, with the flexible circuit 60 interconnecting each rigid PCB 65. The type of construction illustrated in the embodiment of FIG. 1B, having rigid PCB sections interconnected by a flexible circuit, may be referred to as a "rigid flex circuit board."

The memory module connector 20 includes a connector body 22 having a socket 24 and a plurality of electrical terminals 26 disposed within the socket 24. A plurality of electrical terminals 36 are provided along a card edge 32 of the memory module 30. The memory module 30 may be connected to the memory module connector 20 by sliding the card edge 32 into a socket 24 of the memory module connector 20. The electrical terminals 36 along the card edge 32 make electrical contact with aligned electrical terminals 26 in the socket 24, to establish electronic communication between the memory module connector 20 and the memory module 30. A memory controller 14 provided on the motherboard 12 is connected to the memory module connector 20 along a plurality of discrete electrical paths, embodied here as traces 18 on the substrate of a motherboard 12. The traces 18 connect electrical terminals 16 of the memory controller 14 to corresponding electrical terminals 26 on the memory module connector 20. The memory controller 14 typically stores and retrieves (i.e. writes and reads) data to memory by communicating with the memory module 30 via input/output ("I/O") signals. I/O signals transferring information, such as data, addresses where to store the data, device control, setup information, and clocking sent from the memory controller 14, travel along the traces 18 to the memory packages 50. One of the electrical terminals 36 may be a memory chip selector terminal or memory package selector terminal. The memory controller 14 may generate and send a chip-selection signal (another type of input-only signal) along one of the traces 18 to the chip-selector terminal to designate which one of the memory packages 50 is the intended recipient of a particular read/write signal.

A cooling fan 80 provided on or adjacent to the motherboard 12 generates airflow for cooling the memory module 30 and other components of the motherboard 12. An axis of the fan 80 is optionally aligned with the tubular frame 40 so that airflow will generally be aligned with the tubular frame 40. The tubular frame 40 provides an internal airflow pathway for cooling the memory packages 50, as well as for allowing airflow to pass through and around the memory module 30 to other heat-generating motherboard components, with minimal impedance to airflow.

The geometry of the memory module 30 provides favorable cooling characteristics. The tubular frame 40 spaces the memory packages 50 apart, providing a low power density. The tubular design of the frame 40 allows airflow to easily pass through the interior of the tubular frame 40, to cool the memory packages 50. The panels 42A-D of the tubular frame 40 may be formed from a thermally conductive material, such as aluminum, functioning as cooling fins. The tubular frame 40 also protects the memory packages 50. Although not required, the memory packages 50 in this embodiment are positioned on the interior of the tubular frame 40. Therefore, the memory packages 50 and the flexible circuit 60 are protected from impacts to the exterior of the tubular frame 40.

A memory module according to the invention is not limited to embodiments having a square cross-section. Tubular frames of other cross-sectional shapes, including polygonal cross-sectional shapes other than a square, may also be suitable. Examples of other cross-sectional shapes that may be chosen for the tubular frame include a non-square rhombus, a rhomboid (a parallelogram in which adjacent sides are of unequal length), or a trapezoid. Moreover, a tubular frame according to the invention is not limited to having four panels and a quadrilateral cross-sectional shape. For example, an embodiment may be constructed having three panels to form a generally tubular frame, with a triangular cross-section. Another embodiment may have a cross-section with more than four sides. Furthermore, the interconnected panels forming a tubular frame are not required to be flat or of the same size. Also, the panels that provide mounting locations for memory packages need not be directly connected edge to edge like the panels 42A-D. For example, the panels in another embodiment may be coupled with an intervening structure, such as using intermediate panels. In another embodiment, the tubular frame could include a circular tube with flat panels arranged along the perimeter of the circular tube to provide mounting locations for the memory packages.

Figure 2:
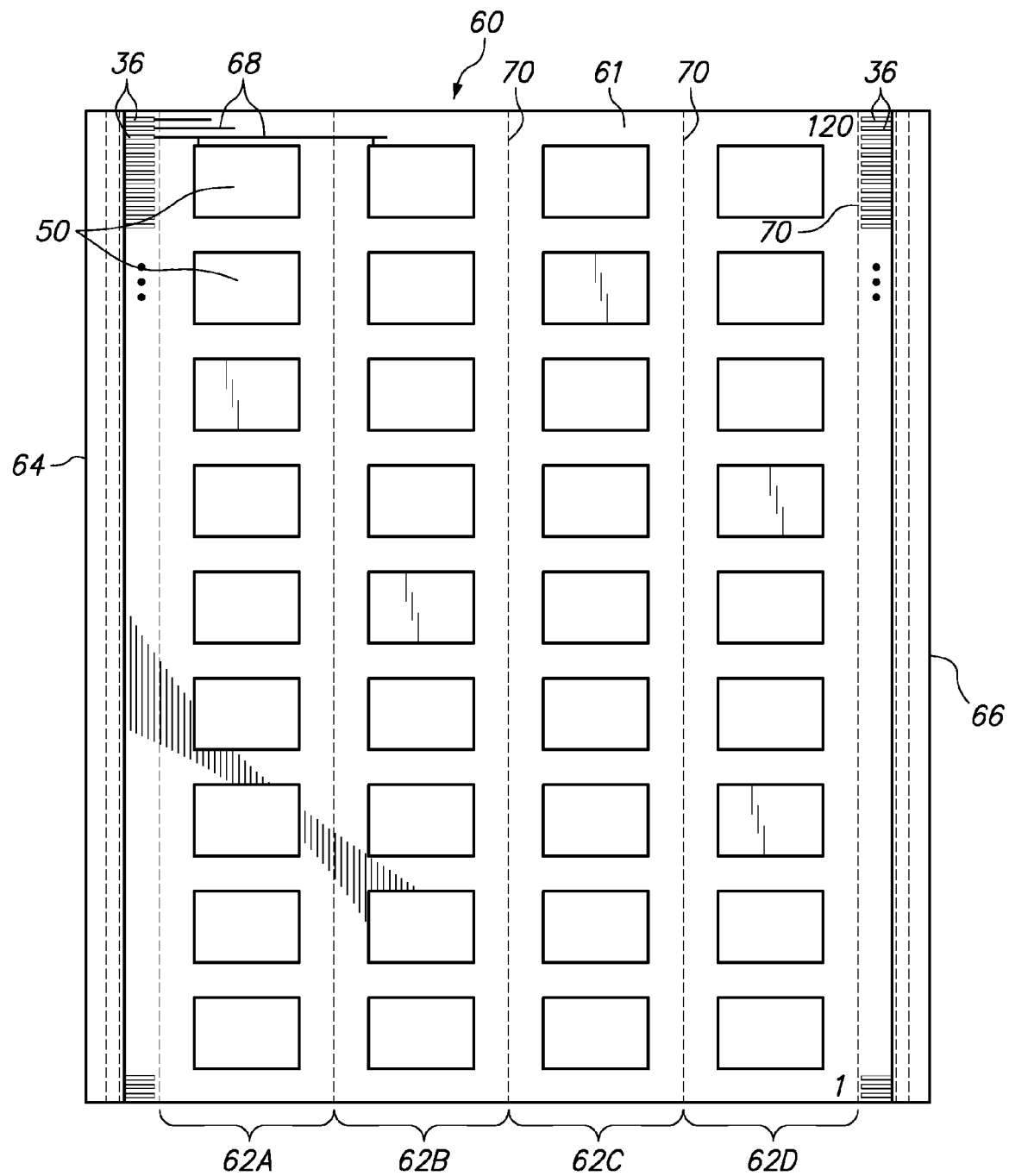
FIG. 2 is a plan view of the flexible circuit provided in the memory module of FIG. 1

FIG. 2 is a plan view of the flexible circuit 60 provided in the memory module 30 of FIG. 1. The flexible circuit 60 includes a flexible substrate 61. The flexible circuit 60 is organized in four equally-proportioned main sections 62A, 62B, 62C, 62D. The packages 50 are secured, directly or indirectly, to one surface of the flexible circuit 60 (facing into the page), in rows of nine packages 50 per row, with one row per section 62A-D. The electrical terminals 36 are provided on an opposing surface of the flexible circuit 60 (facing out of the page), at opposing ends 64, 66 of the flexible circuit 60. The electrical terminals 36 are enlarged in the figure for purposes of illustration, but as many as 120 terminals 36 per row may be included, as labeled. A network of traces 68 electrically connects the electrical terminals 36 with the memory packages 50. The traces 68 may be formed according to known techniques in the art of circuit board manufacturing, such as by etching the traces 68 in a metal layer deposited on the substrate of the flexible circuit 60. The flexible circuit 60 is drawn as a flat pattern, including fold lines 70 indicating locations where the flexible circuit 60 may be folded or bent so that the flexible circuit 60 conforms to the tubular frame.

Figures 3, 3A:
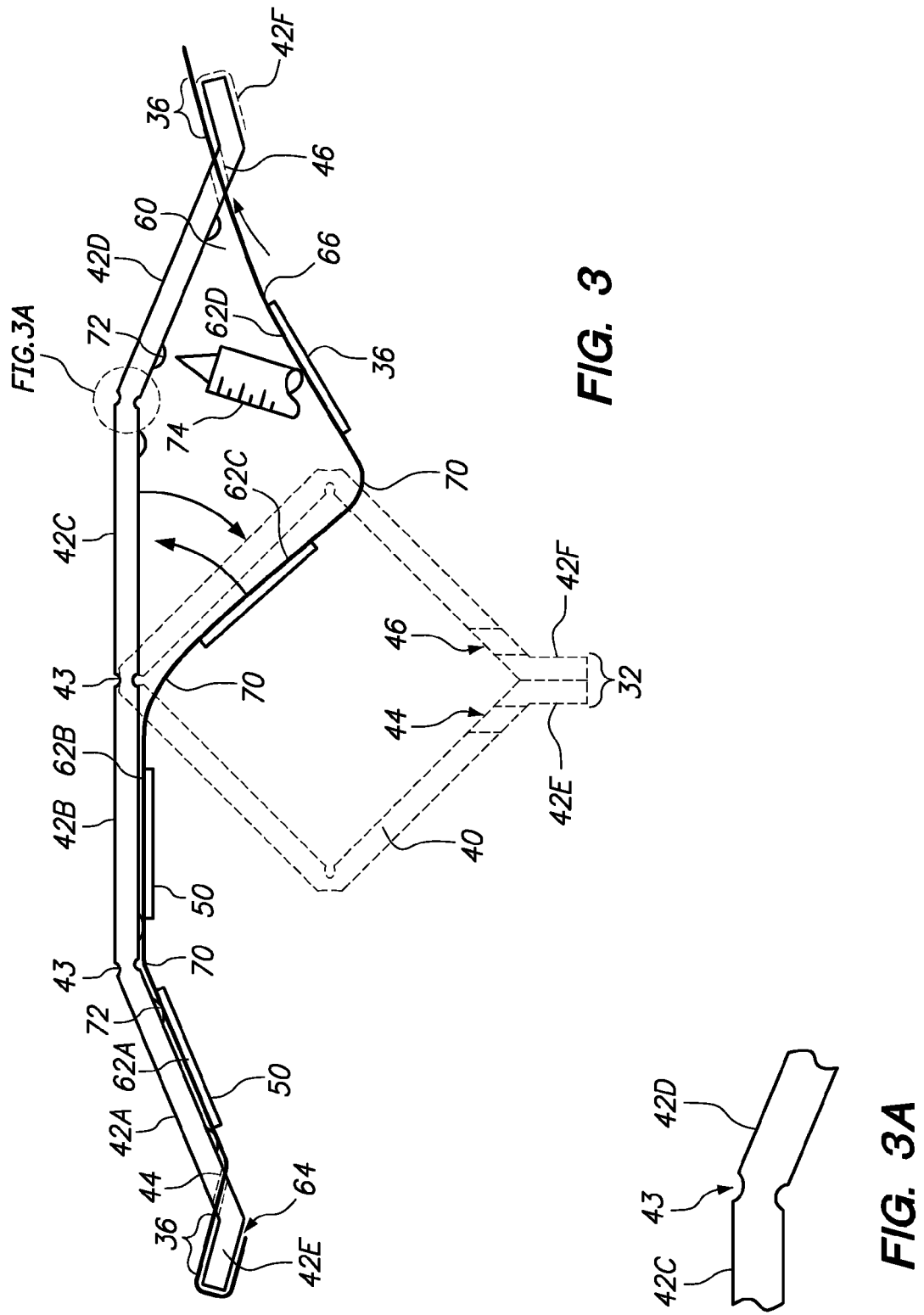
FIG. 3 is a side view of the memory module of FIG. 1 being formed from interconnected panels and the flexible circuit according to an embodiment of the invention.
FIG. 3A is a near view of the portion encircled in FIG. 3, showing the pivot location between adjacent panels.

FIG. 3 is a side view of the memory module of FIG. 1 being formed from interconnected panels 42A-D and the flexible circuit 60 according to an embodiment of the invention. The flexible circuit 60 is being assembled to a surface of the interconnected panels 42A-D, prior to manipulating the interconnected panels 42A-D to form the tubular frame 40. The tubular frame to be formed is indicated using dashed lines. The panels 42A-D may be made from a thermally conductive material such as aluminum or other metal, to maximize heat transfer and cooling. Alternatively, the panels 42A-D may be formed of a durable and economical plastic. The panels are pivotably interconnected at various schematically-depicted pivot locations 43. The pivot locations 43 may be pins or hinges, for example. Alternatively, the panels 42A-D may be formed of a unitary sheet, and the pivot locations 43 may be thinned portions of the unitary sheet for easy bending at the pivot locations 43. To illustrate, FIG. 3A is a near view of the portion encircled in FIG. 3, showing a thinned portion of material at the pivot location 43 between adjacent panels 42C, 42D.

Referring again to FIG. 3, the end 64 of the flexible circuit 60 is inserted into a slot 44 of an outer short panel 42E coupled to the panel 42A, and the opposing end 66 of the flexible circuit 60 is inserted into a slot 46 of another outer short panel 42F coupled to the panel 42D. Portions of the flexible substrate that extend beyond the electrical terminals 36 are wrapped around the ends of outer short panels 42E, 42F, for better adhesion and to prevent peeling of the flexible circuit 60. An adhesive material 72 such as epoxy may be applied with an adhesive applicator 74 at selected locations, as indicated. The flexible circuit 60 may be adhered closely to the surface of the panels 42A-D, with the section 62A of the flexible circuit 60 in general alignment with the panel 42A, the section 62B of the flexible circuit 60 in general alignment with the panel 42B, the section 62C of the flexible circuit 60 in general alignment with the panel 42C, and the section 62D of the flexible circuit 60 in general alignment with the panel 42D.

The flexible circuit 60 is adhered to the panels 42A-D with the fold lines 70 on the flexible circuit 60 aligned with the pivot locations 43 of the interconnected panels 42A-D. The panels 42A-D may be pivoted with respect to one another at the pivot locations 43 to form the tubular frame 40. The flexible circuit 60 bends or folds along the fold lines 70 to accommodate the resulting angles between the panels 42A-D. The flexible circuit 60 is adhered to what becomes the interior surface of the tubular frame 40. The outer short panels 42E and 42F may be brought together and joined (e.g. with more adhesive 72) or otherwise coupled, to form the card edge 32. These steps may be performed by hand, by machine, or a combination thereof. When the interconnected panels 42A-D have been formed into the tubular frame indicated, the opposing ends 44, 46 are positioned on opposing sides of the card edge 32 with the electrical terminals 36 facing outwardly, for making electrical contact with the corresponding electrical terminals 26 of the memory module connector 20 of FIG. 1.

Figure 4:
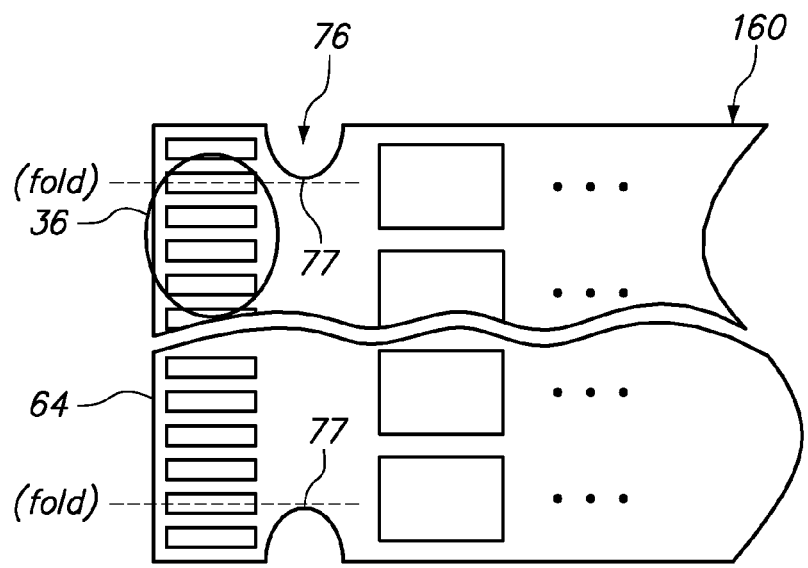
FIG. 4 is a partial plan view of another embodiment of a flexible circuit that accommodates the shortened slots on the tubular frame.

The length of the slots 44, 46 (see FIG. 3) may be reduced to structurally strengthen and increase the rigidity of the tubular frame 40. FIG. 4 is a partial plan view of another embodiment of a flexible circuit 160 that accommodates the shortened slots on the tubular frame. A portion of the flexible circuit 160 indicated at 76, between the electrical terminals 36 and the memory packages 50, is narrowed. The end 64 of the flexible circuit 160 may be temporarily folded at fold lines indicated 77, to fit through the shortened slots. Then, the flexible circuit may be unfolded at fold lines 77 before adhering the end 64 to the card edge of the memory module.

Figure 5:
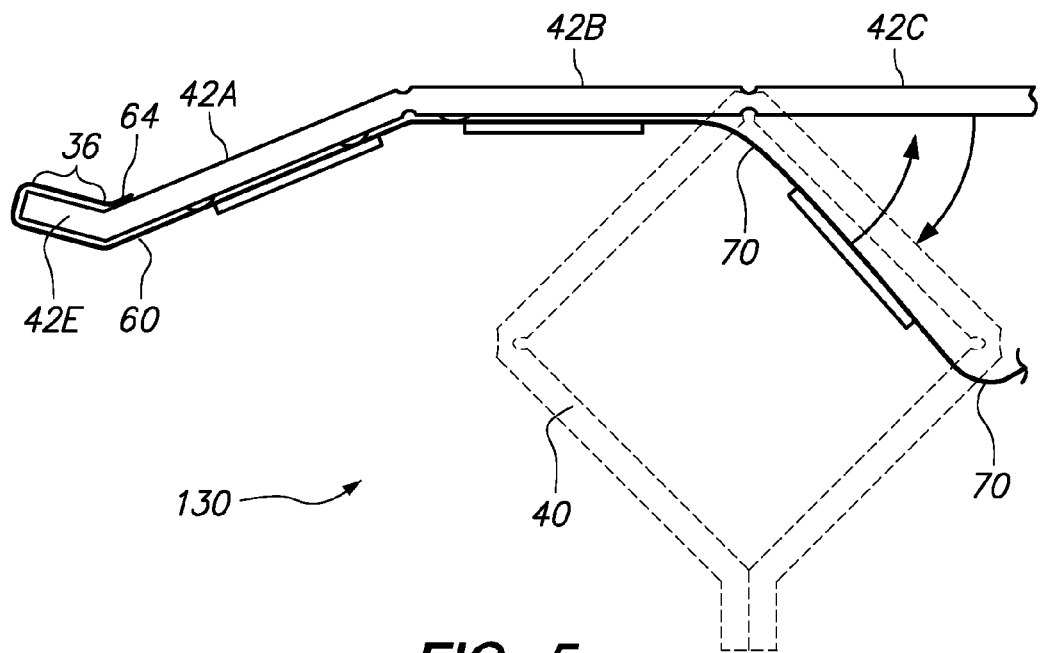
FIG. 5 is a side view of a memory module being formed from interconnected panels and the flexible circuit according to another embodiment of the invention.

FIG. 5 is a side view of a memory module 130 being formed from interconnected panels 42A-D and the flexible circuit 60 according to another embodiment of the invention. The slots 44, 46 of FIG. 3 are omitted from the panels 42A-D in the embodiment of FIG. 5. The flexible circuit 60 is again adhered to the surface of the interconnected panels 42A-D. However, instead of routing the end 64 of the flexible circuit 60 through a slot, the end 64 is wrapped around the end 64 of the outer short panel 42E. The electrical terminals 36 are provided on the opposite surface of the flexible circuit 60 from their location in FIG. 3. Portions of the flexible substrate that extend beyond the electrical terminals 36 are wrapped around the ends of outer short panels 42E, 42F, for better adhesion and to prevent peeling of the flexible circuit 60. The panels 42A-D may be manipulated to form the tubular frame 40, as described in the discussion of FIG. 3.

Figure 6:
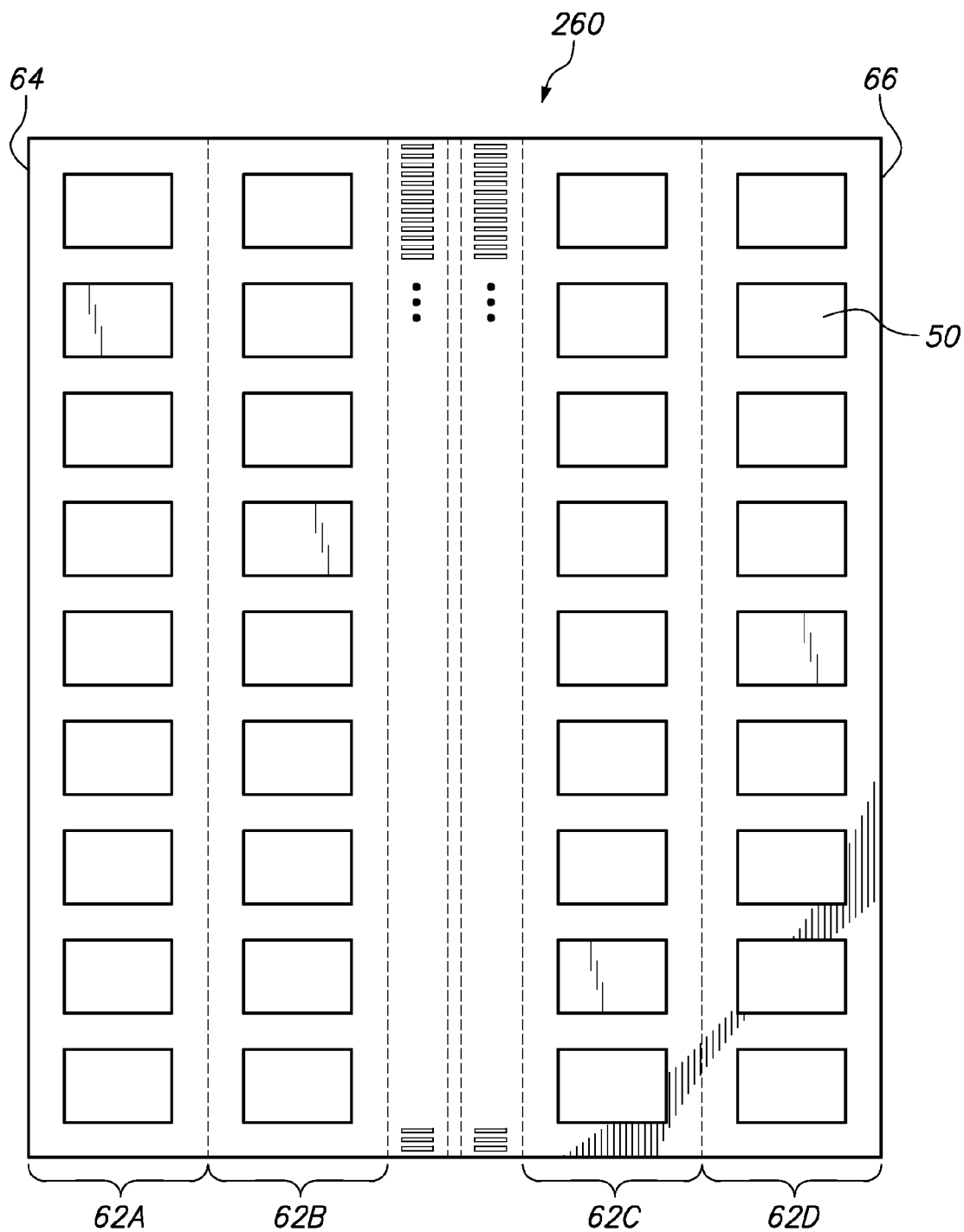
FIG. 6 is a plan view of a flexible circuit according to another embodiment of the invention.

FIG. 6 is a plan view of a flexible circuit 260 according to another embodiment of the invention. The flexible circuit 260 is also organized in the four equally-proportioned main sections 62A, 62B, 62C, 62D. The memory packages 50 are secured directly or indirectly to the flexible circuit 260, again arranged on one surface of the flexible circuit 260 (facing into the page). The electrical terminals 36 are still provided on an opposing surface of the flexible circuit 260 (facing out of the page). However, the electrical terminals 36 are positioned near the center of the flexible circuit 260, between sections 62A, 62B. The fold lines 70 have been repositioned accordingly.

Figure 7:
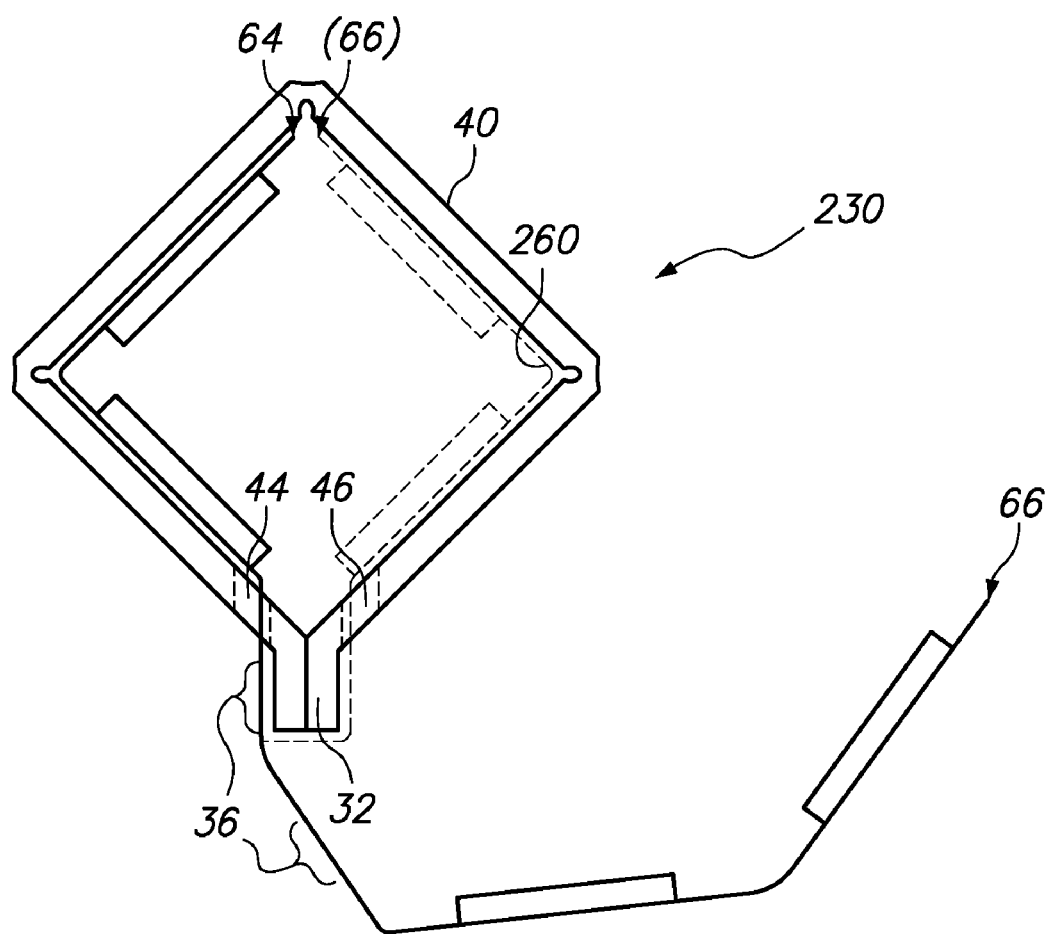
FIG. 7 is a side view of a memory module being formed by applying the flexible circuit in FIG. 6 to a pre-formed tubular frame.

FIG. 7 is a side view of a memory module 230 being formed by applying the flexible circuit 260 of FIG. 6 to a pre-formed tubular frame 40 according to another embodiment. The slots 44, 46 are again included, and have been widened to accommodate the thickness of the flexible circuit 260 and the memory packages 50. The end 64 of the flexible circuit 260 is inserted through the widened slot 64 and is adhered as shown near the top of the frame 40. Likewise, the opposing end 66 of the flexible circuit 260 may be inserted through the widened slot 66 and is also adhered near the top of the frame 40. The flexible circuit 260 follows the contours of the pre-formed tubular frame 40, and wraps around the card edge 32 with the electrical terminals 36 positioned at either side of the card edge 32. The illustrated manner in which the flexible circuit 260 is routed minimizes the likelihood of the terminals 36 being separated from the card edge 32.

Figure 8:
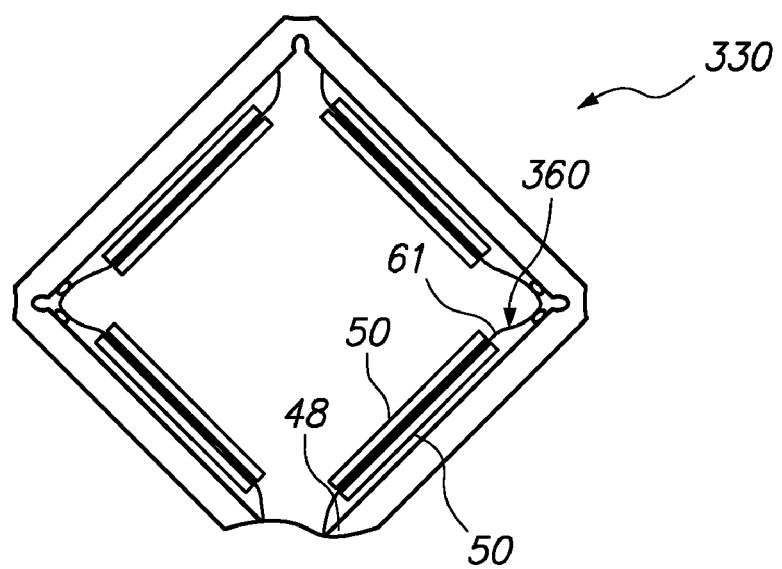
FIG. 8 is a side view of another embodiment of the memory module, wherein the memory packages are provided on both sides of the flexible circuit.

FIG. 8 is a side view of another embodiment of a memory module 330, wherein the memory packages 50 are provided on both sides of a flexible circuit 360. This configuration may provide twice the quantity of memory packages 50 as the embodiments in FIGS. 1-5. The flexible circuit 360 may be provided on the tubular frame 40 as shown in any of FIGS. 1, 3, 5, and 7. If slots are included on the tubular frame, the slots may have to be widened as described above to accommodate the added thickness.

Figure 9:
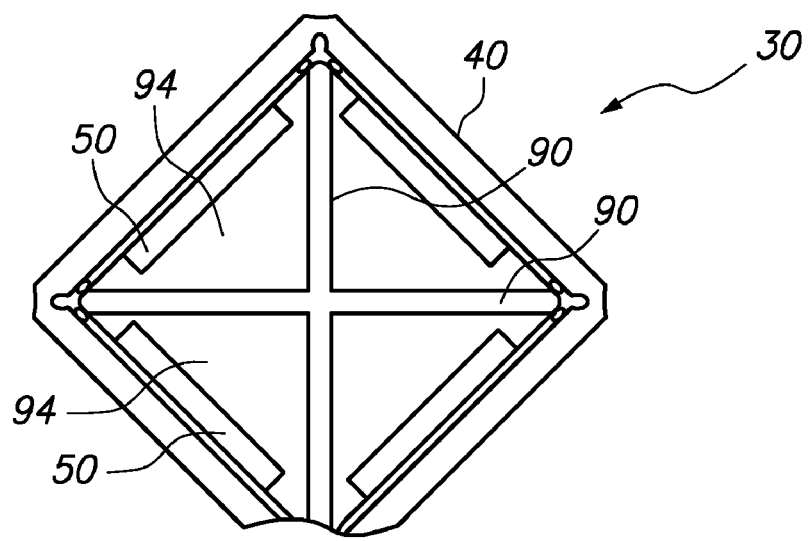
FIG. 9 is a side view of a memory module including support members.

FIG. 9 is a side view of a memory module such as the memory module 30 of FIG. 3, with the addition of support members 90 for increased mechanical integrity. The support members 90 may be, for example, rigid ribs extending along at least a portion of the length of the tubular frame 40 (into the page). The support members 90 traverse the cross-section of the tubular frame 40 to opposing corners 92, and spaced from the memory packages 50. The support members increase the mechanical integrity and stiffness of the tubular frame 40, while still providing airflow channels 94 for air to pass through the tubular frame 40. The use of the support members 90 may be particularly desirable when slots are provided on the tubular frame 40, to compensate for any reduction in mechanical integrity resulting from the slots.

Figure 10:
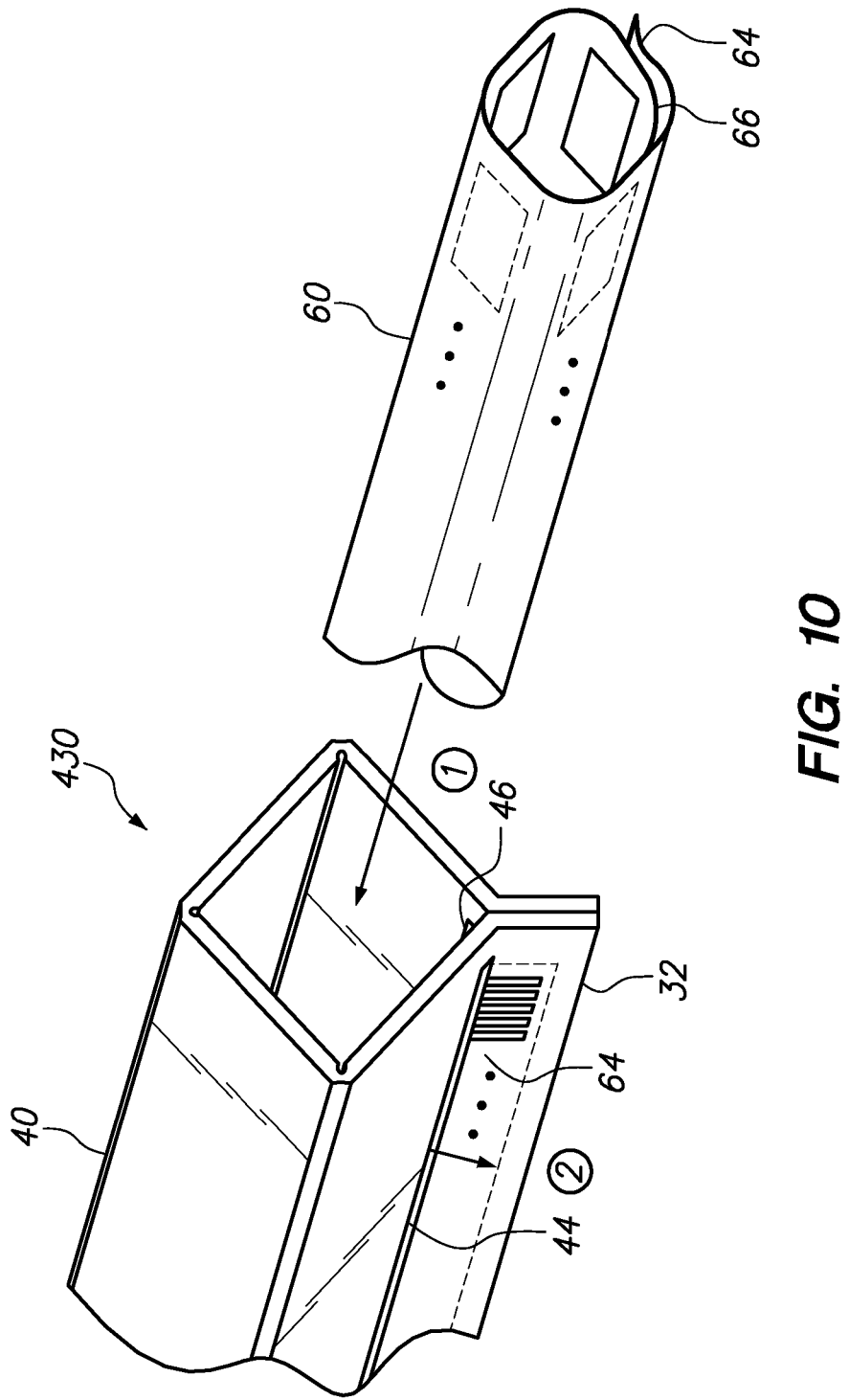
FIG. 10 is a perspective, schematic view of a memory module being formed by inserting a rolled-up flexible circuit into a pre-formed tubular frame.

FIG. 10 is a perspective, schematic view of another embodiment of a memory module 430 being formed by rolling up the flexible circuit 60 and inserting the rolled-up flexible circuit 60 into a pre-formed tubular frame 40. After inserting the rolled-up flexible circuit 60 into the frame 40, the ends 64, 66 may be pulled through the respective slots 44, 46 and then adhered to the card edge 32 as described above.

Figure 11:
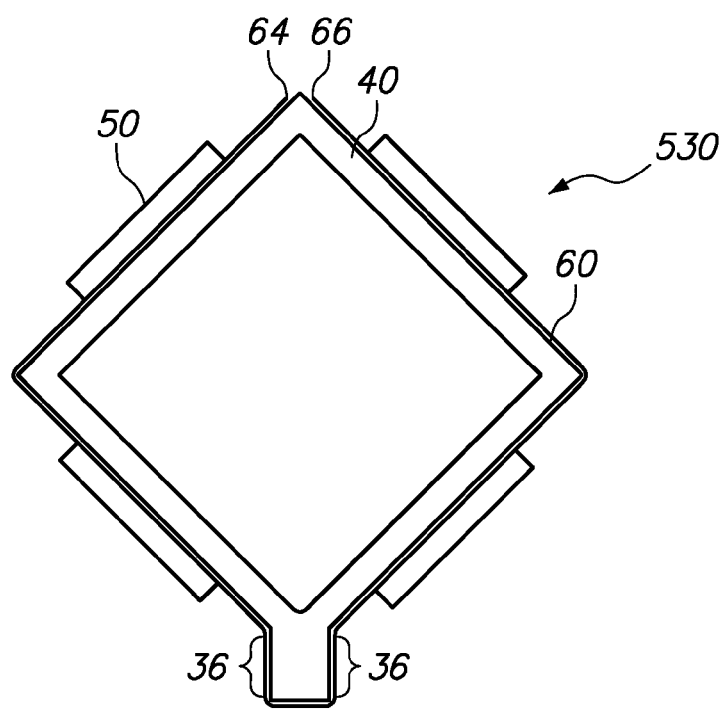
FIG. 11 is a side view of another embodiment of a memory module, wherein a flexible circuit is secured to the exterior surface of the tubular frame.

FIG. 11 is a side view of another embodiment of a memory module 530, wherein a flexible circuit similar to the flexible circuit 260 of FIG. 6 is secured to the exterior surface 49 of the tubular frame 40. The electrical contacts 36 have instead been provided on the same side of the flexible circuit 260 as the memory packages 50. The flexible circuit 260 is routed from one edge 64 near the top of the tubular frame 40 to the other edge 66 near the top of the tubular frame 40. This positions electrical terminals 36 along the card edge 32 as it is layered on the tubular frame 40. Providing the flexible circuit 260 on the outer surface 49 of the pre-formed tubular frame 40 may simplify and reduce the cost of manufacturing the memory module 30.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A computer memory system, comprising:
   a substantially tubular frame with an elongate card edge extending along the frame and a longitudinally-extending slot through the substantially tubular frame; and
   a flexible circuit comprising a flexible substrate, a plurality of memory chips secured to the flexible substrate, and a plurality of electrical terminals interconnected with the memory chips, the flexible circuit being layered along an interior surface of the substantially tubular frame and extending through the longitudinally-extending slot from the interior surface of the tubular frame to the card edge, with the electrical terminals arranged along the card edge.

2. The computer memory system of claim 1, wherein the tubular frame comprises a plurality of panels, with a row of the memory chips supported on each panel.

3. The computer memory system of claim 2, wherein two or more adjacent panels are pivotally coupled.

4. The computer memory system of claim 2, wherein two or more adjacent panels are detachably coupled at adjacent edges.

5. The computer memory system of claim 2, wherein the substantially tubular frame has a polygonal cross-section, with each panel defining a side of the polygonal cross-section.

6. The computer memory system of claim 5, wherein the substantially tubular frame has four panels defining sides of a substantially quadrilateral cross-section of the tubular frame.

7. The computer memory system of claim 1, further comprising:
   a connector body having a memory module socket configured for receiving the card edge and having a plurality of electrical terminals positioned for electrically contacting corresponding electrical terminals of the received card edge.

8. The computer memory system of claim 1, wherein the flexible substrate is disposed along an exterior surface of the tubular frame.

9. The computer memory system of claim 1, further comprising:
   one or more ribs disposed within the substantially tubular frame and traversing a cross-section of the substantially-tubular frame.

* * * * *